United States Patent [19]

Sakurai et al.

[11] Patent Number: 4,677,592

[45] Date of Patent: Jun. 30, 1987

[54] DYNAMIC RAM

[75] Inventors: Takayasu Sakurai, Tokyo; Tetsuya Iizuka, Funabashi, both of Japan

[73] Assignee: Kabushiki Kaisha Toshiba, Kawasaki, Japan

[21] Appl. No.: 739,171

[22] Filed: May 30, 1985

[30] Foreign Application Priority Data

May 31, 1984 [JP] Japan ................ 59-111894

[51] Int. Cl.$^4$ .............................................. G11C 7/00
[52] U.S. Cl. ..................................... 365/222; 365/230
[58] Field of Search .................... 365/222, 230, 233

[56] References Cited

U.S. PATENT DOCUMENTS 4,079,462  3/1978  Koo ........................... 365/222
4,333,167  6/1982  McElroy ..................... 365/222
4,390,972  6/1983  Machida ..................... 365/222

OTHER PUBLICATIONS

Kawamoto, et al., "A 288Kb CMOS Pseudo SRAM", IEEE International Solid-State Circuits Conference, ISSCC, p. 276, (1984).

Primary Examiner—Joseph A. Popek
Attorney, Agent, or Firm—Finnegan, Henderson, Farabow, Garrett & Dunner

[57] ABSTRACT

In a dynamic RAM, the refreshing operation is performed during one cycle of the read or write operation. A switch circuit selects either a row address signal output from address input circuit or a refresh row address signal output from a refresh circuit. By controlling the switch circuit by a switch selector, the refresh is performed during the operation delay time of the address input circuit or an input/output circuit for inputting and outputting data.

3 Claims, 7 Drawing Figures

DYNAMIC RAM

BACKGROUND OF THE INVENTION

The present invention relates to a semiconductor memory device, and more particularly to a dynamic RAM (random access memory) requiring a refresh.

Figure 1:
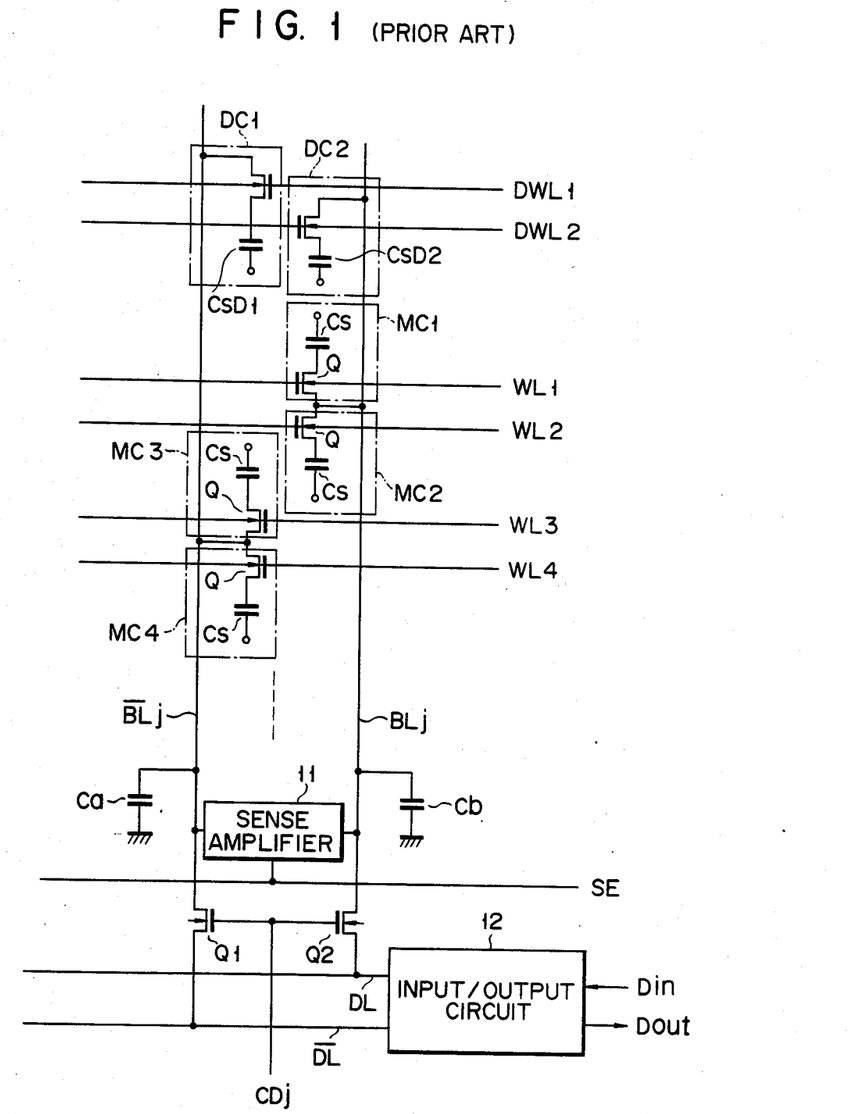
FIG. 1 is a circuit diagram illustrating a dynamic RAM of prior art.

An example of how a conventional dynamic RAM is configured is shown in FIG. 1. In the figure, the dynamic RAM is partially illustrated, with a pair of bit lines $\overline{BLj}$ and BLj (j=1, 2, 3, . . .) and their peripheral circuitry. Each of memory cells MC1, MC2, . . . is made up of a capacitor Cs and a transfer gate (MOS FET) Q. A charged state of the capacitor Cs represents data "1", while a discharged state of it, data "0". To select memory cells MCi (i=1, 2, 3, . . .), the transfer gates Q of the memory cells MC1, MC2, . . . are selectively controlled in conduction by potentials of the word lines WL1, WL2, . . . , respectively. To select a specific memory cell MCij, the word lines WL1, WL2, . . . and the bit line pair $\overline{BLj}$ and BLj are driven. The data is read out from the selected memory cell MCij onto the bit line pair $\overline{BLj}$ and BLj. The data read out is amplified by a sense amplifier 11. The sense amplifier 11 is controlled by a sense amplifier enable signal SE. Dummy cells DC1 and DC2 are provided for the bit line pair $\overline{BLj}$ and BLj in a one-to-one correspondence manner. These dummy cells DC1 and DC2 are selected by the word lines DWL1 and DWL2, respectively. To read out the data from the memory cells MC3 and MC4 connected to the bit line $\overline{BLj}$, the dummy cell DC2 is selected. The capacitances of the capacitors CsD1 and CsD2 of the dummy cells DC1 and DC2 are respectively selected to be half the capacitance of the capacitors Cs of the memory cells MC1, MC2, . . . The data stored in memory cells MC1 and MC2 are respectively read out lines $\overline{DL}$ and DL and each item of data is represented by a potential or the bit line pair $\overline{BLJ}$ and by, which is amplified by the sense amplifier. The transfer gates Q1 and Q2 are controlled in conduction by the output signal DCj of a column decoder (not shown). The data read out of the memory cell MCij onto the data line pair $\overline{DL}$ and DL are output as read out data Dout through an input/output circuit 12. The write data Din is written into the memory cell MCij through the input/output circuit 12 in in reverse order in which it was read out. The bit line pair $\overline{BLj}$ and BLj are inevitably accompanied by stray capacitances Ca and Cb, respectively.

Figure 2:
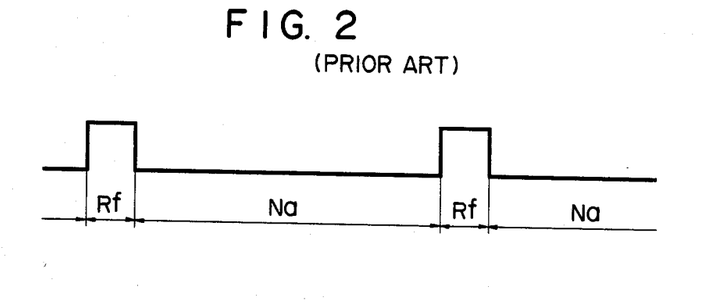
FIG. 2 illustrates a timing chart for explaining the refresh operation of the RAM of FIG. 1.

The charge stored in the memory cells MC1, MC2, . . ., as data, leaks and decreases with time. To cope with this stored charge decrease problem, it is necessary to read out the data before it completely disappears, and to write the same data into the memory cells, again. This operation is called a refresh. The refresh is essential to the dynamic RAM. In a dynamic RAM of 256 Kilo bits, all of the memory cells are refreshed every 4 mS. The refresh restrains the normal memory operation speed of the dynamic RAM. For example, as shown in FIG. 2, the refresh Rf is required every fixed period. During this period Rf, the normal memory operation Na is impossible. During the refreshing period of the memory cell MC1, for example, the potentials on the bit line pair $\overline{BLj}$ and BLj correspond in magnitude to the data stored in the memory cell MC1. Under this condition, it is impossible to read out the data from other memory cells connected to the bit line pair $\overline{BLj}$ and BLj. Thus, during the refreshing period, any attempt to gain access to these other memory cells connected to the same bit line pair $\overline{BLj}$ and BLj is rejected. For this reason, to gain access to the memory cells, the user must wait till the refreshing operation terminates. This makes the access time long and it difficult to speed up the memory operation.

Figure 3:
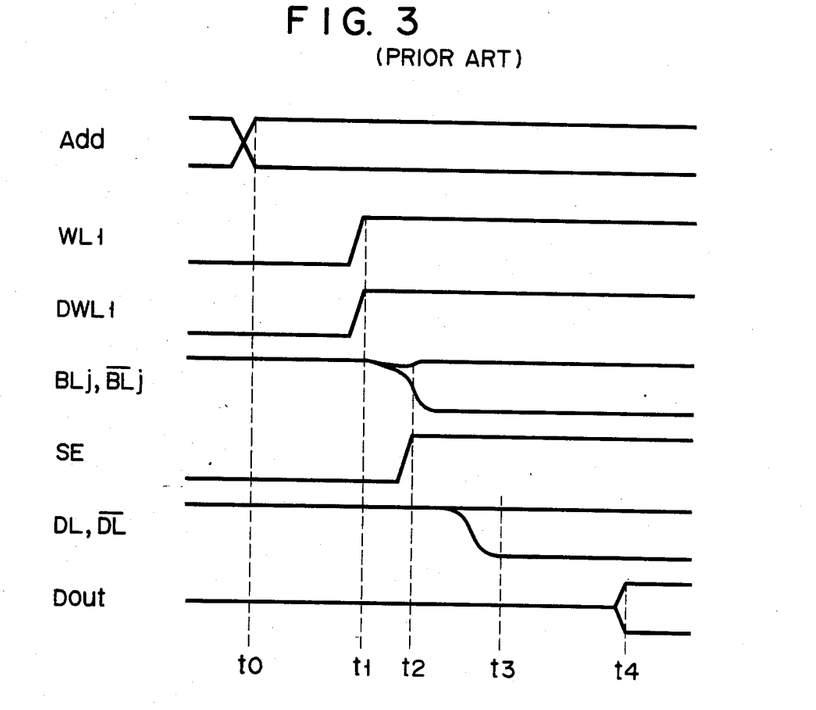
FIG. 3 shows a timing chart for explaining the memory operation of the circuit of FIG. 1.

The refresh operation and the normal memory operation, i.e. the read and the write operations, will be described referring to a timing chart shown in FIG. 3. At time t0, the first cycle of the operation of the dynamic RAM starts when an address signal Add changes or a chip enable signal is applied to the RAM. At time t1, any one of the word lines WL1, WL2, . . . (in this example, the word line WL1) is selected by the output signal of a row decoder (not shown). Upon this selection, the word line WL1 becomes "H" in logical level, and a memory cell MC1 is selected. The data is read out from the memory cell MC1 onto the bit line BLj connected to this memory cell MC1. At this time the word line DWL1 is "H", and a signal as a reference is read out of the dummy cell DC1 to the bit line $\overline{BLj}$. Then, the potentials on the bit line pair $\overline{BLj}$ and BLj start to change. The sense amplifier enable signal SE becomes "H" in logical level (time t2), and the sense amplifier 11 is operated. Then, these potentials are differentially amplified. One of the potentials is "H", and the other is "L" in level. At this time, the word line WL1 is "H". Therefore, the transfer gate Q of the memory cell MC1 is in an on state. Accordingly, the memory cell MC1 is refreshed by the output signal of the sense amplifier 11.

In a read out mode of the RAM, the bit line pair $\overline{BLj}$ and BLj are set to "L" or "H" level by the output signal of the sense amplifier 11. Under this condition, if this column is selected by the output signal CDj of the column decoder, the transfer gates Q1 and Q2 are turned on. As they are turned on, these transfer gates allow the potentials on the data lines $\overline{DL}$ and DL to be applied to the input/output circuit 12 (time t3). At time t4, an output signal Dout, which is waveshaped by the input/output circuit 12, is obtained.

As described above, the dynamic RAM requires a smaller number of circuit elements than the static RAM. However, the former has a disadvantage that it is difficult to increase the memory speed. Further, users of the dynamic RAM must inevitably find the optimum timing for the refresh operation. This work is troublesome for the users.

SUMMARY OF THE INVENTION

Accordingly, an object of the present invention is to provide a dynamic RAM which eliminates the delay by the refresh (so as to speed up the access time) and the troublesome work of finding timings for the refresh.

According to the present invention, there is provided a dynamic RAM comprising a plurality of word lines, a plurality of bit lines disposed crossing the word lines, a memory array made up of memory cells located at the cross points of the word lines and the bit lines, a row decoder and a column decoder for specifying a given address in the memory array, a sense amplifier for amplifying data read out of one specified memory cell in the memory array through the bit lines, an address input circuit for supplying a signal for addressing to the row decoder and the column decoder, a refresh circuit for refreshing the memory cells of the memory array for each row by supplying a refresh row address signal to the row decoder, switching means for selectively supplying to the row decoder a row address signal output from the address input circuit or a refresh row address signal output from the refresh circuit, an input/output circuit for waveshaping the output signal from the sense amplifier or the signal representative of data to be written into the specified memory cell, and control means for selecting the output signal of the refresh circuit while the addressing signal is decoded by the address input circuit or while the input/output circuit is operated by controlling the switching means, thereby making the refresh of the memory cells during a normal access operation.

With such an arrangement, the delay of the access time due to the refresh operation is decreased to speed up the memory operation. In operation, users can use the dynamic RAM without regard to the timings for the refreshing operation.

DETAILED DESCRIPTION OF THE PREFERRED EMBODIMENTS

Figure 4:
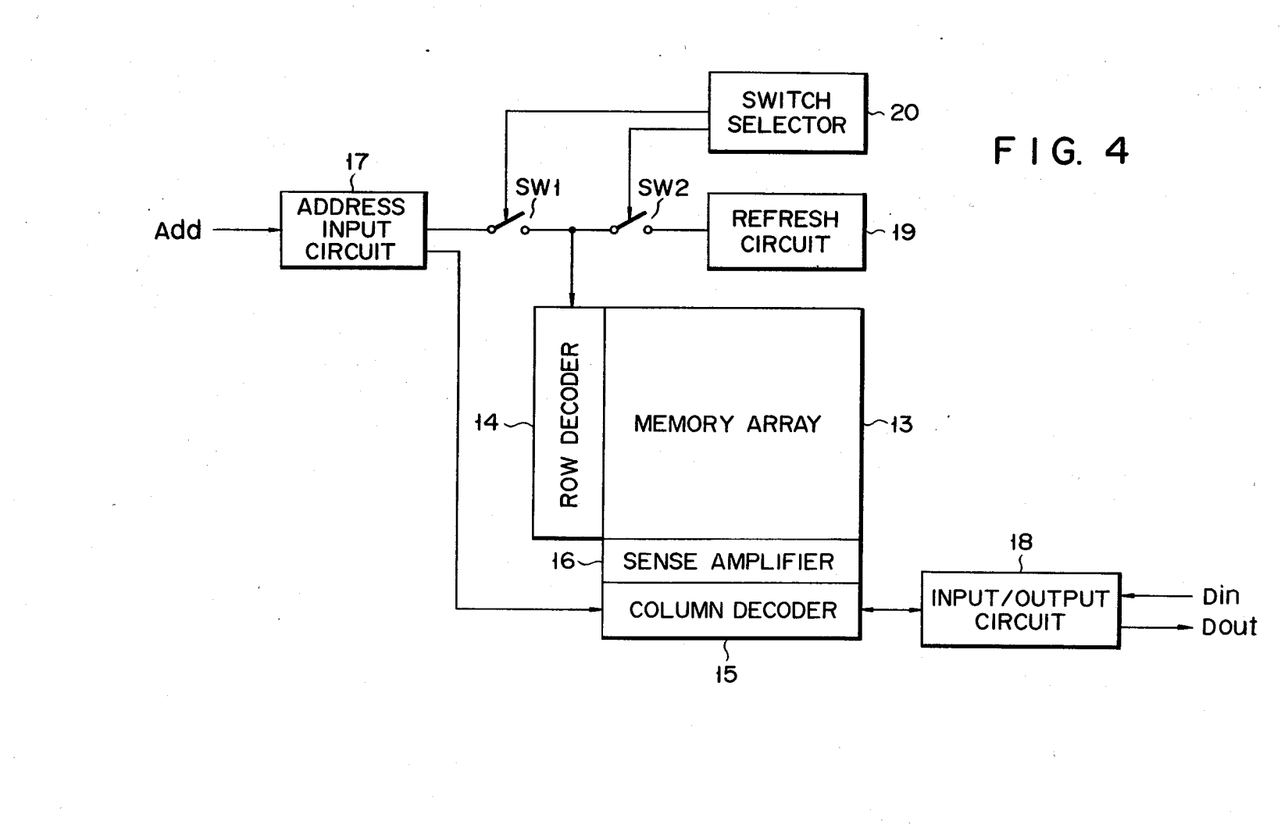
FIG. 4 is a block diagram illustrating an embodiment of a dynamic RAM according to the present invention.

Reference is made to FIG. 4 illustrating a first embodiment of a dynamic RAM according to the present invention. Of a group of memory cells making up a memory array 13, those arrayed in the row direction are selected by a row decoder 14. The memory cells in the column direction are selected by a column decoder 15. The data read out from the memory array 13 is amplified by a column sense amplifier 16. An address input circuit 17 waveshapes an address signal Add as input thereto, and supplies it to the decoder 14 and the column decoder 15. According to the output signals from the decoders 14 and 15, the memory array 13 is addressed and a memory cell at the address is specified. An input/output circuit 18 waveshapes input data Din and supplies it to the memory cell selected by the output signals of the decoder 14 and the column decoder 15. The input/output circuit 18 also waveshapes data read out from the memory cell as selected by the decoder 14 and the column decoder 15, and provides output data Dout. The refresh circuit 19 refreshes the memory cells of the memory array. Either of the output signals of the refresh circuit 19 or the address input circuit 17 is selected by switches SW1 and SW2 according to their switching states. The switches SW1 and SW2 are selectively on/off controlled by the output signal from the switch selector 20.

The memory array 13 is arranged, as shown in FIG. 1. A plurality of word lines and a plurality of bit lines are intercrossed. Memory cells are located at the cross points to form an array of memory cells.

Figure 5:
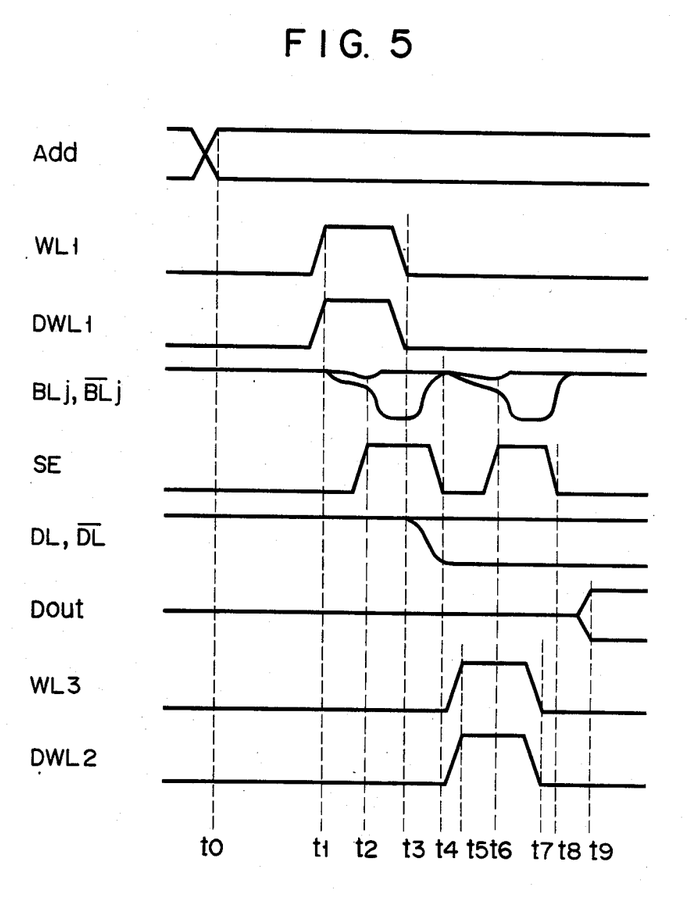
FIG. 5 shows a timing chart for the operation of the circuit of FIG. 4.

The operation of this dynamic RAM will be described referring to a timing chart shown in FIG. 5. At time t0, an address signal Add changes or upon reception of a chip enable signal, the RAM is enabled. A first cycle of the memory operation starts. At this time, the switch selector 20 places the switch SW1 in an on state, and the switch SW2 in an off state. Under this condition, the circuit state of the RAM is equal to that of the RAM of FIG. 1. The operation of the RAM to refresh the memory cell MC3 when the data is read out from the memory cell MC1 in FIG. 1 will be given. At time t1, the word line WL1 is selected by the output signal from the decoder 14, so that the logical state of the signal on the word line WL1 is "H". The memory cell MC1 is selected, and data stored in the memory cell MC1 is read out therefrom onto the bit line BLj. At this time, potential on the word line DWL1 is "H" in logical level, to read out a signal as a reference from a dummy cell DC1 onto the bit line $\overline{BLj}$. Then, potentials on the bit line pair $\overline{BLj}$ and BLj start to change. The potentials on the bit line pair $\overline{BLj}$ and BLj are amplified by a column sense amplifier 16 when it is operated in response to a sense amplifier enable signal SE of "H" (time t2). As a result of the amplification, the potential of one of the bit line pair $\overline{BLj}$ and BLj is "H", while the other is "L". Those potentials are supplied to the data lines $\overline{DL}$ and DL (time t3). At this time t3, the signals on the word lines WL1 and DWL1 are "L". The potentials on the data lines $\overline{DL}$ and DL are supplied to the input/output circuit 18, where these are waveshaped. After a predetermined time, i.e. at time t9, output data Dout is outputted. The duration from time t3 to time t9 is a delay time as given by the input/output circuit 18. During this period, the memory cell MC3 is refreshed. At time t5, the switches SW1 and SW2 are controlled by the output signal of the switch selector 20 to respectively be in an off state and an on state. By a refresh address output from the refresh circuit 19, the word line WL3 is selected. At time t4, the bit line pair $\overline{BLj}$ and BLj are set in a precharge state by a sense amplifier enable signal SE of "L". In this state, the potentials on the bit lines start to change according to the data stored in the memory cell MC3. At time t5, the word line DWL2 is "H" in level, so that the dummy cell DC2 is selected. At time t6, the sense amplifier enable signal SE is "H" in logical level. In response to this "H" signal, the sense amplifier 11 is operated to amplify the changing potentials on the bit line pair $\overline{BLj}$ and BLj. One of the bit line potentials becomes "H" in level, while the other becomes "L". Accordingly, the data stored in the memory cell MC3 is refreshed. At time t7, the word lines WL3 and DWL2 are "L". At time t8, the sense amplifier enable signal SE is "L".

In this way, the memory cell MC3 is refreshed while the access operation to the memory cell MC1 is performed.

At the end of one cycle of the memory operation, the switch selector 20 turns on the switch SW1, and turns off the switch SW2. The next new address signal Add is input to the address input circuit 17. The second cycle of the memory operation starts.

Figure 6:
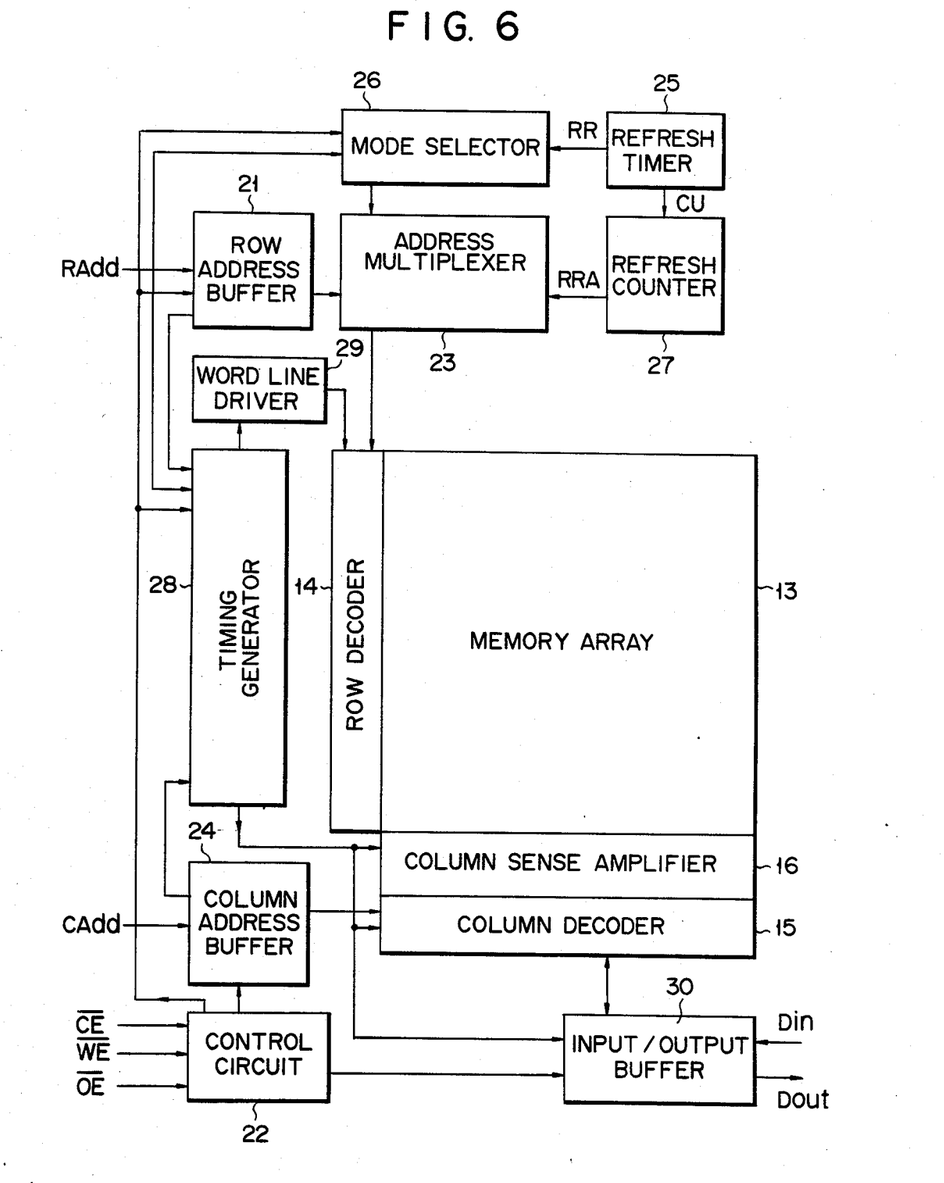
FIG. 6 is a block diagram of a detailed circuit arrangement of the circuit of FIG. 4.

FIG. 6 shows the details of the circuit of FIG. 4. In FIG. 6, like symbols are used for designating like or equivalent portions in FIG. 4. A row address buffer 21 waveshapes a row address signal RAdd. The buffer 21 is controlled by the output signal from a control circuit 22. Under this control, the buffer 21 is selected. At this time, the buffer 21 produces a row address signal Add as waveshaped and applies it to an address multiplexer 23. A column address buffer 24 receives a column address signal CAdd, and waveshapes the signal. The buffer 24 produces the column address signal CAdd as waveshaped when this buffer 24 is selected under control of the control circuit 22, and applies the signal to a column decoder 15. The row address buffer 21 and the column address buffer 24 correspond to an address input circuit in FIG. 4.

A refresh timer 25 produces pulses at fixed time intervals, i.e. every time the refresh is required. When the the refresh is required, the timer 25 applies a refresh request signal to a mode selector 26, which is for selecting either a normal memory operation mode (normal mode) or a refresh mode. At this time, the timer 25 applies a count-up signal CU to a refresh counter 27. Upon receipt of this signal CU, the counter 27 counts up to increase the refresh row address by one. The refresh row address means an address to be refreshed. The refresh counter 27 sequentially counts up by the output pulse of the refresh timer 25, to produce a refresh row address. The refresh timer 25 and the refresh counter 27 correspond to the refresh circuit 19 in FIG. 4. The refresh row address signal RRA output from the refresh counter 27 is supplied to the address multiplexer 23.

The multiplexer 23 corresponds to the switches SW1 and SW2 in FIG. 4. The mode selector 26 selects either of the row address signal RAdd supplied to the multiplexer 23 or the refresh row address signal RRA. The mode selector 26 corresponds to the switch selector 20 in FIG. 4. The signal selected is supplied to a row decoder 14. The selector 26 receives a request signal for the normal mode (referred to as a normal request signal) from the control circuit 22 and also receives a refresh request signal RR from the refresh timer 25. In place of receiving the normal request signal, a change in the row address signal RAdd can be detected from the row address buffer 21. If some operation is being performed in the memory array 13, the reception of the request signal is rejected. Whether such operation is present or not is detected by the signal transfer between the timing generator 28 and the mode selector 26. When that operation terminates, the normal or the refresh request signal is accepted. For example, for the acceptance of the refresh request signal RR, by the address multiplexer 23, the refresh row address signal RRA output from the refresh counter 27 is supplied to the row decoder 14. Then, the refresh operation is performed. When the normal request signal is accepted, the row address signal RAdd output from the row address buffer 21 is supplied to the row decoder 14. The normal memory operation is executed. When the requests for the refresh mode and the normal mode concurrently occur, either of the request signals has a priority to operate. The mode selector 26 must prevent the concurrence of both the normal and the refresh modes.

In addition to the signal transfer to and from the mode selector 26, the timing generator 28 has the following function. In response to the signals from the row address buffer 21, the column address buffer 24, and the control circuit 22, the generator 28 controls the timings in the operations of the word line driver 29, the column sense amplifier 16, the column decoder 15, and the input/output buffer 30. The word line driver 29 is a bootstrap circuit for applying a higher voltage than the power voltage to the word lines. The output signal of the driver 29 is applied to the row decoder 14. The driver 29 is controlled by the timing generator 28, as mentioned above. A chip enable signal $\overline{CE}$, a write enable signal $\overline{WE}$, and an output enable signal $\overline{OE}$ are applied to the control circuit 22. In response to these signals, the control circuit 22 controls the related circuits. The input/output buffer 30 corresponds to the input/output circuit 18 in FIG. 4, and is controlled by the timing generator 28 and the control circuit 22.

The timing generator 28, the column sense amplifier 16, the column decoder 15, the row decoder 14, the input/output buffer 30 and the control circuit 22 are similar to those in the conventional dynamic RAM. In this embodiment, the input/output buffer 30 is not operated in the fresh mode. The reason for this is that it is not necessary to inform an exterior unit as to the contents of the memory cell as refreshed. Prevention of the operation of the buffer 30 is realized in the following way, for example. A refresh request signal from the mode selector 26 is detected by the timing generator 28. The column sense amplifier 16 is controlled by the output signal of the timing generator 28, to block the transfer of the output signal of the column sense amplifier 16 to the input/output buffer 30.

The selection of the row address signal Add or the refresh row address signal RRA is required only for the access of a memory cell connected to the bit line which is also connected to a memory cell to be refreshed. The refresh is performed only one time for a much longer time than the access time to the memory cell. For the other time, the memory operation is performed as in the conventional dynamic RAM. Thus, when the data stored in the memory cell is to be refreshed, if the memory cell on the bit line connected to the former is not accessed, it is sufficient to merely perform the refreshing. Neither outputting data to exterior units nor fetching an address is required for the refresh. The refreshing operation is performed at high speed.

As described above, in this embodiment, the refresh is performed during the write or the read period of data to and from the memory cell. Therefore, users can use the dynamic RAM of this embodiment with no concern for the refresh timing. In practical use, the dynamic RAM of this embodiment can be handled as if it is a static RAM. Additionally, this RAM can be fabricated with substantially the same chip area as that of the conventional RAM. An integration density of the memory cells of this dynamic RAM, when fabricated, is approximately four times that of the usual static RAM.

In the above-mentioned embodiment, the refresh follows the normal memory operation, i.e. the read operation or the write operation. Alternatively, this may be performed before the normal operation by making use of the operation delay time of the row address buffer 21 and the column address buffer 24.

There is a situation that at the start of the refresh, the address signal Add changes and the normal operation must be performed. In such a situation, the refresh is followed by the normal operation in this embodiment.

Figure 7:
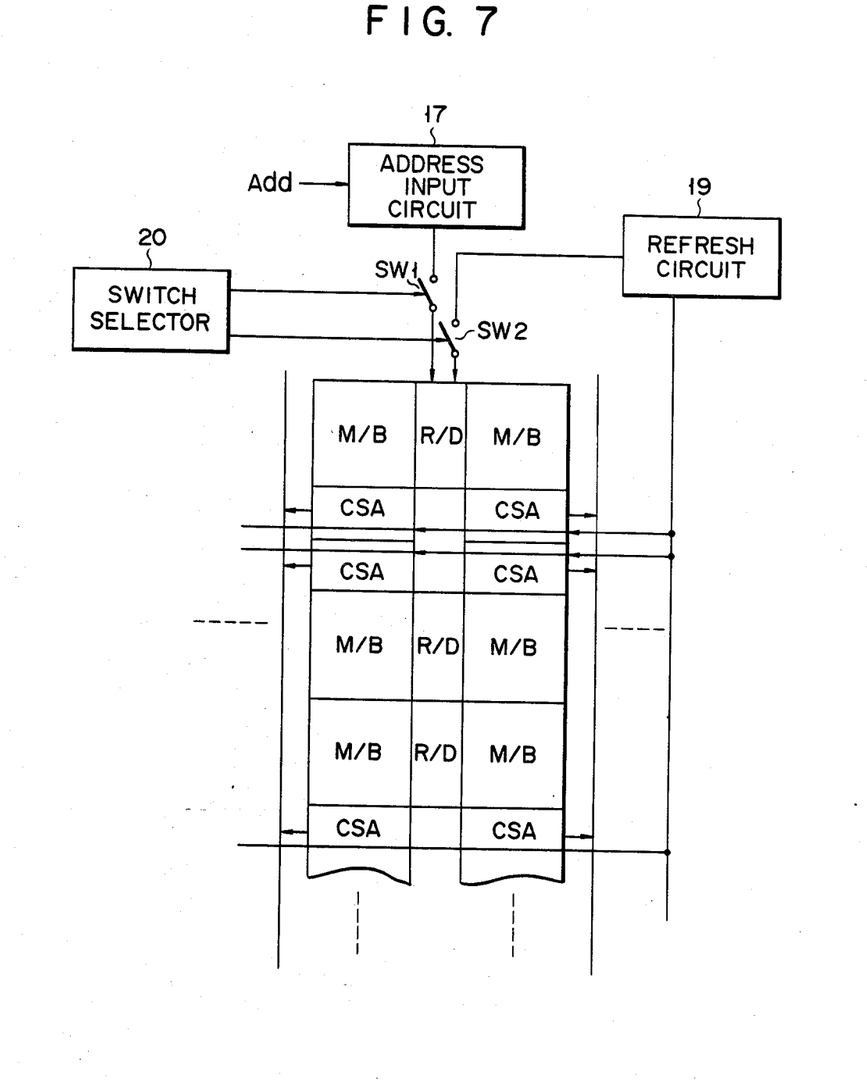
FIG. 7 shows a block diagram of another embodiment of a dynamic RAM according to the present invention.

FIG. 7 shows another embodiment of a dynamic RAM according to the present invention. When the parasitic capacitances Ca and Cb of the bit line pairs $\overline{BLj}$ and BLj are large, a long time is taken for reading out data from the memory cell to the bit line pair, the bit line delay time is long. Accordingly, the refresh is slow. Thus, when the bit line delay time is long, the refresh may fail to terminate within the access time. To cope with this problem, the bit lines are divided into a plurality of segments. In FIG. 7, each bit line is formed vertically, as viewed in the drawing. The bit line is divided into a plurality of segments by a plurality of memory cell blocks M/B. Each memory cell in each memory block is selected by the related row decoder R/D. The row decoders R/D are selectively connected through switches SW1 and SW2 to the address input circuit 17 or the refresh circuit 19. The switched SW1 and SW2 are under the control of the switch selector 20.

In this embodiment, if the bit lines are divided into n segments, the bit line capacitor Ca and Cb are 1/n in capacitance, and the refresh operation is speeded up about n times. The charge for the whole bit line capacitor CB (Ca+Cb) is 1/n because it is given by (CB×VDD) where VDD is a power voltage). The refresh time is also 1/n.

What is claimed is:

1. A dynamic RAM comprising:
   a plurality of word lines;
   a plurality of bit lines disposed to cross said word lines;
   a memory array including a plurality of memory cells located at the cross points of said word lines and said bit lines;
   a control circuit, which receives a chip enable signal, a write enable signal, and an output enable signal;
   a timing generator, being controlled by the output of said control circuit;
   a row decoder specifying a row address of said memory array;
   a column decoder, being controlled by the output of said timing generator, for specifying a column address of said memory array;
   a sense amplifier, being controlled by the output of said timing generator, for amplifying data read out from a selected memory cell in said memory array through said bit line;
   a refresh timer means for outputting a refresh request signal and a count-up signal at predetermined times when a refresh is required;
   a refresh counter, receiving the count-up signal from said refresh timer means and sequentially counting up in response to said count-up signal, thereby sequentially producing a refresh row address signal;
   a row address buffer, being controlled by the output of said control circuit, said row address buffer receiving the row address signal, waveshaping and outputting the row address signal, and supplying a signal to said timing generator, when said memory array is being operated;
   a column address buffer, being controlled by the output of said control circuit, said column address buffer receiving a column address signal, waveshaping and supplying the column address signal to said column decoder, and supplying a signal to said timing generator, when said memory array is being operated;
   a word-line driver, which receives the output of said timing generator, said word-line driver serving as a bootstrap circuit means for applying a voltage higher than that of a power source voltage to said word lines, and supplying an output thereof to said row decoder;
   an input/output buffer, being controlled by the output of said control circuit and the output of said timing generator, for waveshaping the output of said sense amplifier or data selected to be written into said memory cell;
   an address multiplexer, receiving the refresh row address signal output from said refresh counter and the row address signal output from said row address buffer, and selecting the refresh row address signal or the row address signal and supplies the selected signal to said row decoder; and
   a mode selector, receiving the timing signal output from said timing generator and the refresh request signal output from said refresh timer, and controlling, in response thereto, the selecting operation of said address multiplexer, in such a manner that during normal access operation, the row address signal output from said row address buffer is supplied to said row decoder, and at times when the refresh is required, the refresh row address signal output from said refresh counter is supplied to said row decoder, and at times when the refresh and normal access operation are required simultaneously, the row address signal output from said row address buffer is supplied to said row decoder, to thereby perform a normal access operation, and the refresh row address signal is supplied to said row decoder during an operation delay time of said input/output buffer or of said row address buffer and said column address buffer which falls within the normal access operation, to thereby perform the refresh.

2. A dynamic RAM according to claim 1, in which each of said memory cells includes a transfer gate and a capacitor.

3. A dynamic RAM according to claim 1, in which said bit lines are each divided into a plurality of segments.

* * * * *